United States Patent [19]
Ueda et al.

[11] Patent Number: 5,298,774
[45] Date of Patent: Mar. 29, 1994

[54] GATE ARRAY SYSTEM SEMICONDUCTOR INTEGRATED CIRCUIT DEVICE

[75] Inventors: Kimio Ueda; Yasunobu Nakase, both of Hyogo, Japan

[73] Assignee: Mitsubishi Denki Kabushiki Kaisha, Tokyo, Japan

[21] Appl. No.: 844,920

[22] Filed: Mar. 5, 1992

Related U.S. Application Data

[63] Continuation of Ser. No. 637,288, Jan. 3, 1991, abandoned.

Foreign Application Priority Data

Jan. 11, 1990 [JP] Japan .................................. 2-5654

[51] Int. Cl.$^5$ ............................................ H01L 27/10
[52] U.S. Cl. ................................ 257/206; 257/208; 257/210
[58] Field of Search ................ 357/45; 257/202, 204, 257/205, 206, 208, 220

[56] References Cited

U.S. PATENT DOCUMENTS 4,661,815  4/1987  Takayama et al. ............... 257/206
4,771,327  9/1988  Usui ................................ 357/45

OTHER PUBLICATIONS

Masuda et al., "A CMOS Analog and Digital Master Slice LSI", Feb. 26, 1987, 1987 IEEE International Solid-State Circuits Conference, pp. 146-147.

Primary Examiner—J. Carroll
Attorney, Agent, or Firm—Lowe, Price, LeBlanc & Becker

[57] ABSTRACT

Disclosed is a semiconductor integrated circuit device of a gate array system making it possible to mount a digital circuit and a high-precision analog circuit on a common substrate. This semiconductor integrated circuit device includes a basic cell array formed by a plurality of NMOS transistors and a plurality of PMOS transistors formed in rows on a semiconductor substrate. The basic cell array includes a plurality of N well regions formed in rows on the semiconductor substrate, P well regions and well terminal regions. The P well regions or N well regions are divided into small regions of the other conductivity type.

6 Claims, 10 Drawing Sheets

GATE ARRAY SYSTEM SEMICONDUCTOR INTEGRATED CIRCUIT DEVICE

This application is a continuation of U.S. Ser. No. 07/637,288, filed Jan. 3, 1991, now abandoned.

BACKGROUND OF THE INVENTION

1. Field of the Invention

The present invention relates generally to gate array system semiconductor integrated circuit devices and particularly to gate array system semiconductor integrated circuit devices enabling mounting of a digital circuit and an analog circuit on a common chip.

2. Description of the Background Art

FIG. 5 is a plan view of a chip of a gate array system including a conventional complementary metal oxide semiconductor. Referring to FIG. 5, the chip of the gate array system including the complementary metal semiconductor (hereinafter referred to as CMOS) includes input/output buffer regions 11, and a basic cell array region 12. The input/output buffer regions 11 interface, with circuits external to the chip, a circuit formed by wiring on the basic cell array region 12. The basic cell array region 12 includes an NMOS transistor array 3 where a plurality of N channel MOS field effect transistors (hereinafter referred to as NMOS transistors) are arranged in rows; and a PMOS transistor array 4 where a plurality of PMOS transistors are arranged in rows. A basic cell is formed by an NMOS transistor and a PMOS transistor adjacent to each other in the basic cell array 12.

FIG. 6 is an enlarged view of the region B surrounded by broken lines in FIG. 5. Referring to FIG. 6, the region B includes NMOS transistor regions 3, PMOS transistor regions 4, oxide film regions 51 isolating corresponding NMOS transistor region 3 and PMOS transistor region 4, oxide film regions 52 for isolation between the NMOS transistor regions 4, and between the PMOS transistor regions 3, and well terminal regions 101, 102 formed between the oxide film regions 52. The reference numeral 1 indicates an N well region, and the reference numeral 2 indicates a P well region. The structures of the N well region 1 and P well region 2 will be described afterwards.

FIGS. 7 and 8 are sectional views taken along the line b—b' and the line c—c' in the region B of FIG. 6. Referring to FIG. 7, the NMOS transistor region 3 includes: a P well region 2 formed by injecting P type impurity (such as boron) into an N type substrate 6; a plurality of N+ diffusion layers 7 having a high N type impurity concentration formed in wells of the P well region 2; gate oxide films 8 formed on the respective N+ diffusion layers 7; and gate electrodes 9 formed on the respective gate oxide films 8. Thus, one of the N+ diffusion layers 7 opposite to each other with respect to the gate electrode 9 is a drain and the other is a source, whereby the NMOS transistor region 3 is formed.

Referring to FIG. 8, the PMOS transistor region 4 includes: an N well region 1 formed by injecting N type impurity (such as phosphorus) into the N type substrate 6; a plurality of P+ diffusion layers 7' having a high P type impurity concentration formed on the N well region 1; and gate oxide films 8 and gate electrodes 9 formed on the respective P+ diffusion layers 7'. Thus, the PMOS transistor region 4 is formed.

FIGS. 9 and 10 are sectional views taken along the lines x—x' and y—y' in FIG. 6. Referring to FIG. 9, a well terminal region 101 is formed between N channel transistor regions and it contains P type impurity. A well terminal region 102 is formed between adjacent P channel transistor regions and it contains N type impurity. The well terminal regions 101, 102 are used to connect a power supply line and a ground line formed on the P well region 2 and the N well region 1. An oxide film region 51 is formed between the NMOS transistor region 3 and PMOS transistor region 4. This oxide film region 51 isolates the NMOS transistor region 3 and the PMOS transistor region 4 from each other. An oxide film region 52 is formed between the diffusion layer 7 and the well terminal 101, and between the diffusion layer 7' and the well terminal region 102.

FIG. 11 is a diagram showing a semiconductor integrated circuit where an analog circuit and a digital circuit are mounted by wirings on prescribed portions of the gate array system chip described with reference to FIGS. 5 to 10. Referring to FIG. 11, wirings formed on this chip include a ground wiring 15, a power supply wiring 16, signal lines 181 to 188 connected to gates, drains and sources of prescribed MOS transistors, and a wiring 191 formed on the signal line 182 and connecting the drains of the NMOS transistors and the power supply wiring 16. The signal line 188 and the wiring 191 are connected by a through hole 22. The ground wiring 15 and the well terminal 101, and the power supply wiring 16 and the well terminal 102 are connected by contact holes. The MOS transistors having the gates connected to the ground wiring 15 and the power supply wiring 16 through contact holes are reversely biased, whereby the MOS transistors on both sides of the reversely biased MOS transistors are isolated.

FIG. 12 is a circuit diagram of a semiconductor integrated circuit to which the wirings in FIG. 11 are applied. Referring to FIG. 12, the analog circuit is a circuit which compares levels of input signals VI1 and VI2, and provides an output of comparison, and it is shown on the left side from the chain line in FIG. 12. The digital circuit is an inverter circuit on the right side from the chain line.

In order to operate the analog circuit shown in FIG. 12 with high precision, it is necessary to connect well terminals of NMOS transistors Tr1, Tr2, Tr3 to the sources of the respective transistors as shown in FIG. 13. However, as described above, generally in the semiconductor integrated circuit device of the CMOS gate array system, the well terminal regions 102 of the PMOS transistors are connected to the power supply wiring 16 through the contact holes, and the well terminal regions 101 of the NMOS transistors are connected to the ground wiring 15. Thus, the well terminals of the NMOS transistors are uniformly set to the ground potential and, in consequence, when the sources and the well terminals are connected, the potential of the sources are caused to be at the ground potential.

For this reason, in the semiconductor integrated circuit device of the gate array system provided with the analog circuit and the digital circuit, the analog circuit is a circuit having a low precision as shown in FIG. 12.

SUMMARY OF THE INVENTION

Therefore, an object of the present invention is to provide a semiconductor integrated circuit device of a gate array system making it possible to mount a digital circuit and a high-precision analog circuit on a common circuit.

Another object of the present invention is to divide well regions in a semiconductor integrated circuit device making it possible to mount a digital circuit and a high precision analog circuit on a common substrate.

Briefly stated, a semiconductor integrated circuit device of a gate array system according to the present invention includes an N type semiconductor substrate, input/output buffer regions, and a basic cell array region. The input/output buffer regions are used as interfaces of input and output signals between the circuit formed in the basic cell array region and an external circuit. The basic cell array region includes N well regions formed in rows on the semiconductor substrate, P well regions formed in parallel on the N well regions, and N type dividing regions dividing each of the P well regions into a plurality of areas. Source, drain, and gate electrodes are formed on the N well regions along the column direction of the N type semiconductor substrate. Source, drain and gate electrodes are formed along the column direction of the substrate on the plurality of divided P well regions. The well terminal regions are formed in parallel in the PMOS transistor regions or NMOS transistor regions and they are connected to the P well regions or N well regions.

Thus, according to the present invention, parts of NMOS transistor regions in the basic cell array region are divided in the well regions and consequently it is possible to connect the PMOS transistor or NMOS transistor to the well terminals. As a result, it is possible to mount a digital circuit and a high-precision analog circuit on a common substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
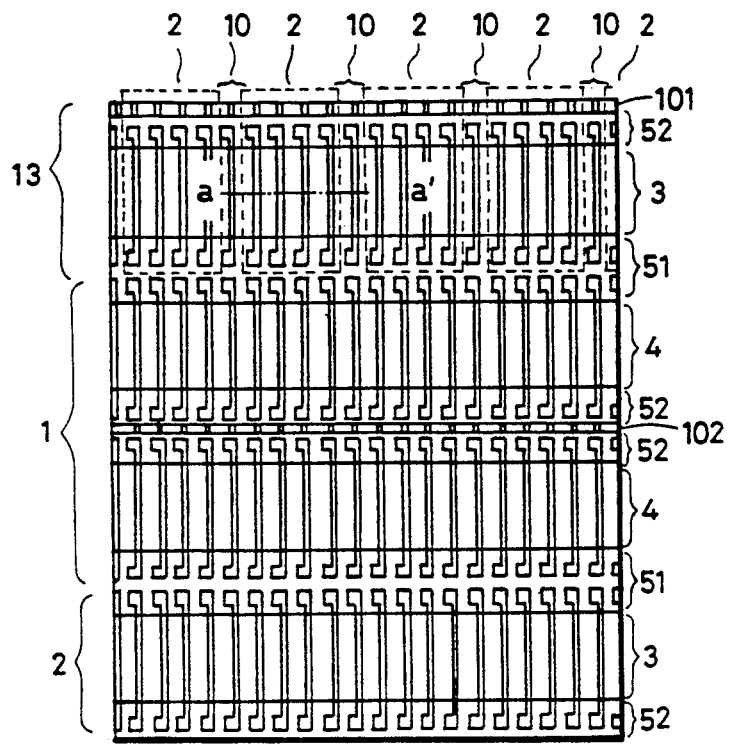
FIG. 1 is a structural view of a basic cell array according to an embodiment of the present invention.
Figure 6:
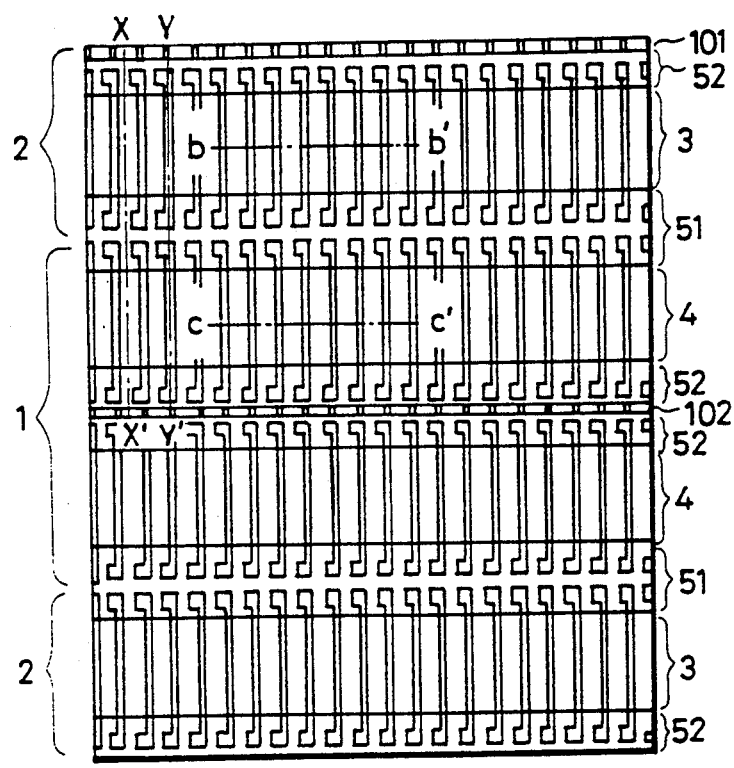
FIG. 6 is a structural view of a conventional basic cell array.
Figure 7:
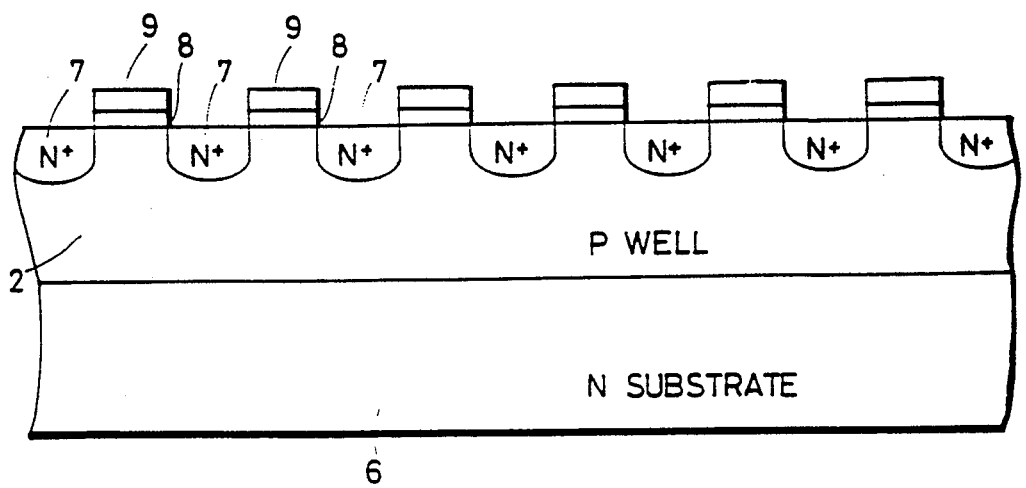
FIG. 7 is a sectional view taken along the line b—b' in FIG. 6.
Figure 8:
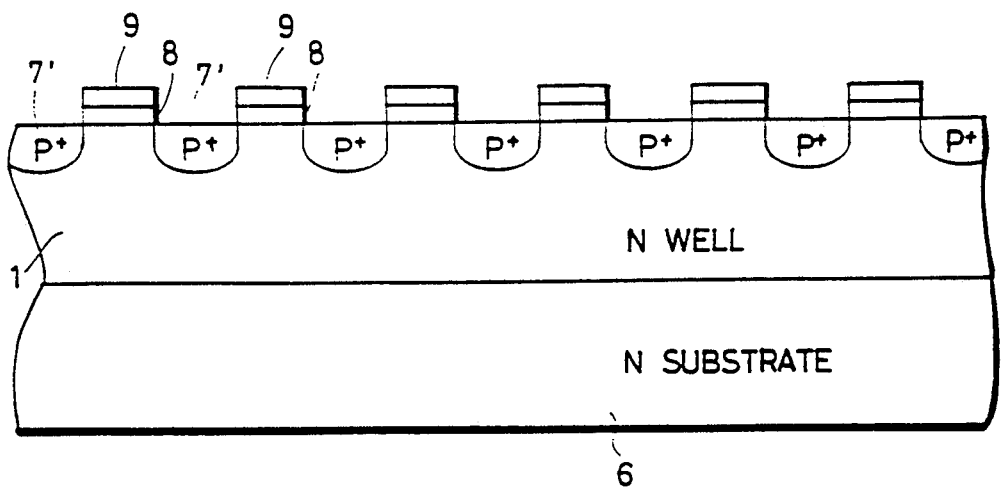
FIG. 8 is a sectional view taken along the line c—c' in FIG. 6.
Figure 9:
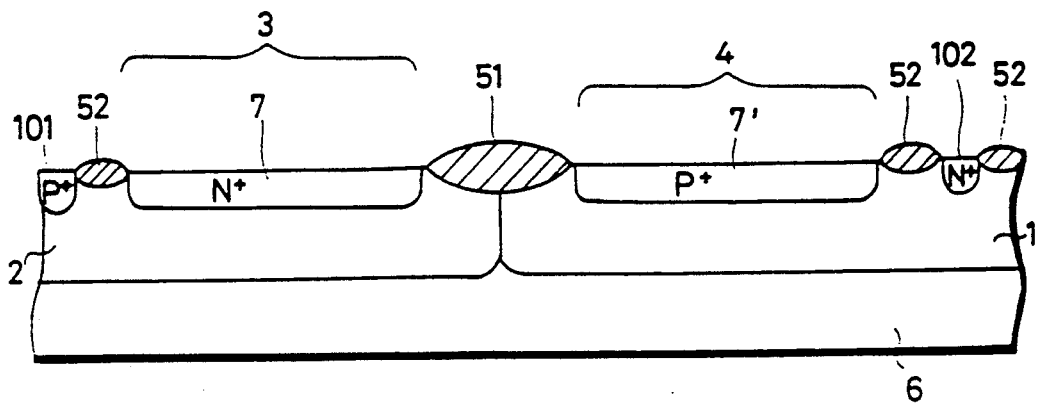
FIG. 9 is a sectional view taken along the line x—x' in FIG. 6.
Figure 10:
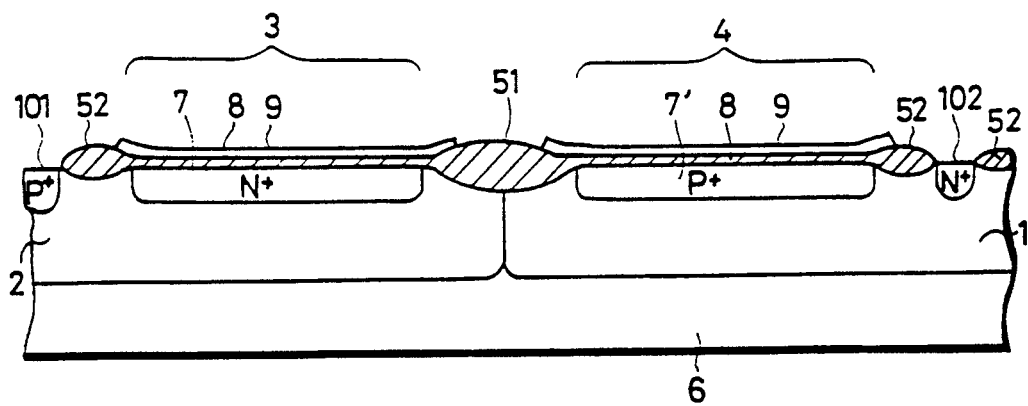
FIG. 10 is a sectional view taken along the line y—y' in FIG. 6.

A difference between a gate array system semiconductor integrated circuit according to the present invention and a conventional gate array system semiconductor integrated circuit resides in basic cell array regions. Therefore, description will be made of a structure of a basic cell array region according to the present invention. FIG. 1 is an enlarged view of a part of the basic cell array region, which corresponds to FIG. 6. Referring to FIG. 1, the basic cell array region is different from the basic cell array region in FIG. 6 in that the basic cell array region 12 includes N type dividing regions 10 dividing P well regions 2 of an NMOS transistor array 13. The dividing regions 10 will be described in more detail with reference to the enlarged sectional view along the line a—a'.

Figure 2:
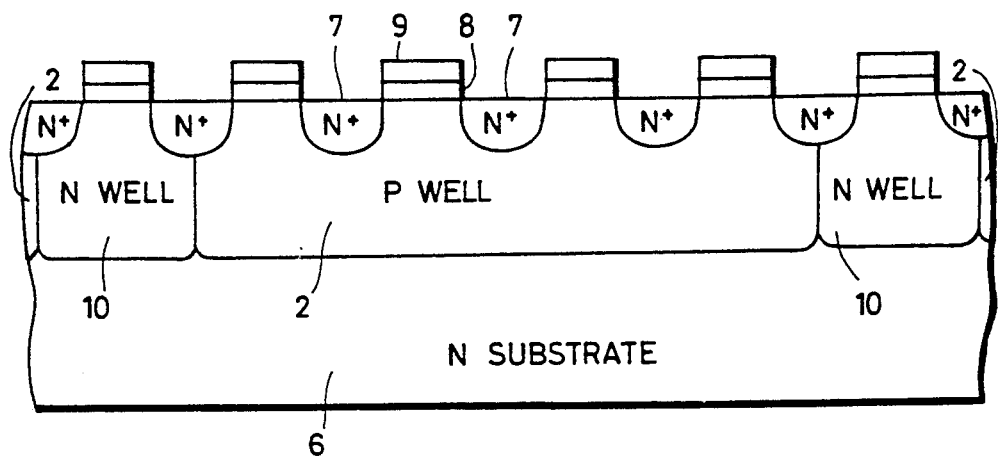
FIG. 2 is a sectional view taken along the line a—a' in FIG. 1.

FIG. 2 is an enlarged view of the section along the line a—a' in FIG. 1. Referring to FIG. 2, the transistor array 13 includes an N substrate 6, P well regions 3 formed on the N substrate 6, N dividing regions 10 for division of the P well regions 2, N+ diffusion layers 7 having a high N impurity concentration, gate oxide films 8, and gate electrodes 9. One of the N+ diffusion layers 7 with the gate electrode 9 therebetween is a drain and the other of the N+ diffusion layers 7 is a source, whereby an NMOS transistor region 3 is formed. The N type dividing regions 10 divide the plurality of P well regions 2 into a plurality of regions and it is possible to connect well terminal regions 101 of the divided P well regions 2 to arbitrary wirings. Each dividing region 10 is formed for four columns of gate electrodes 9 but those dividing regions 10 may be formed in arbitrary positions.

Figure 3:
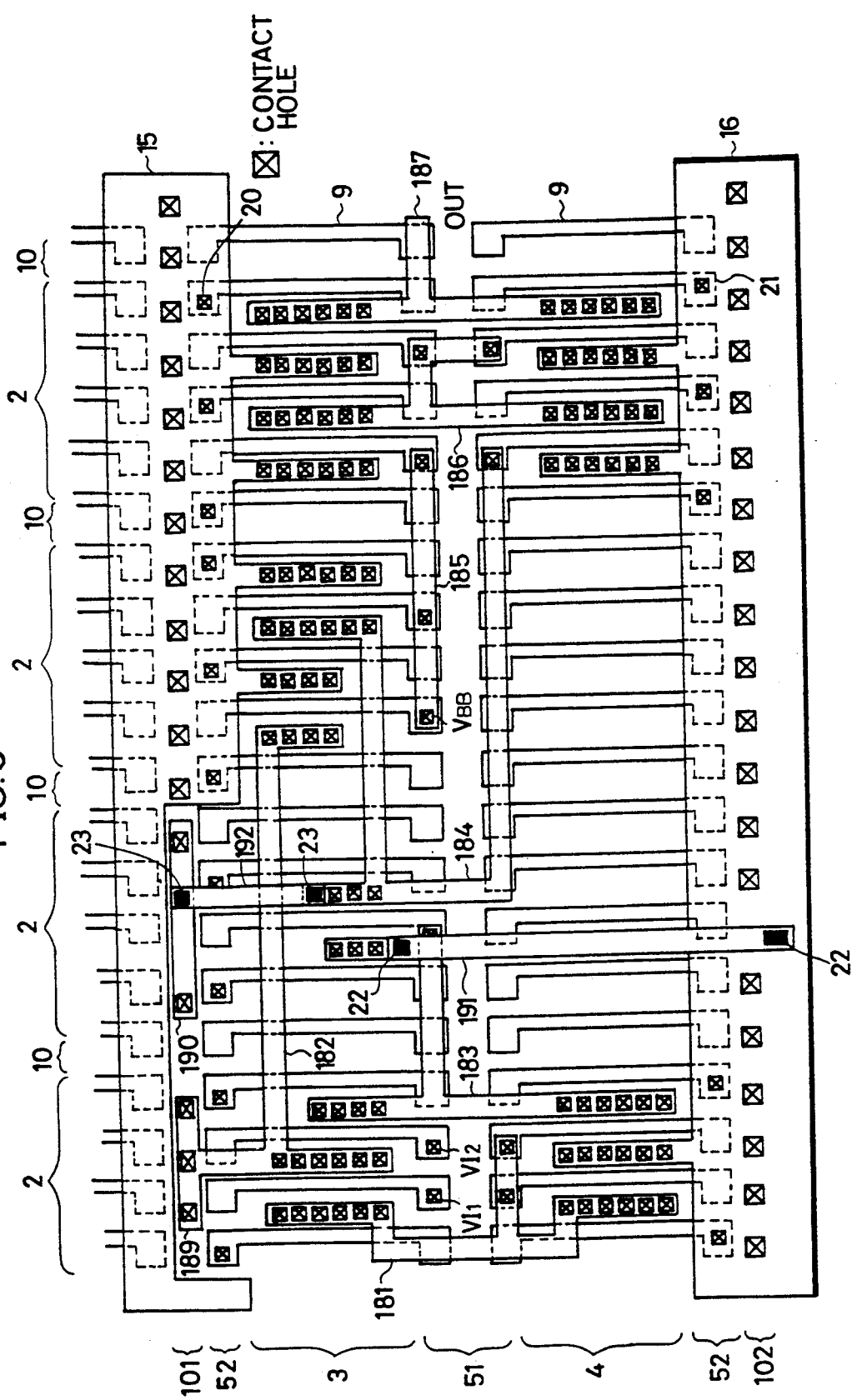
FIG. 3 is an enlarged view showing a state where wirings are applied to the basic cell array in FIG. 1.
Figure 11:
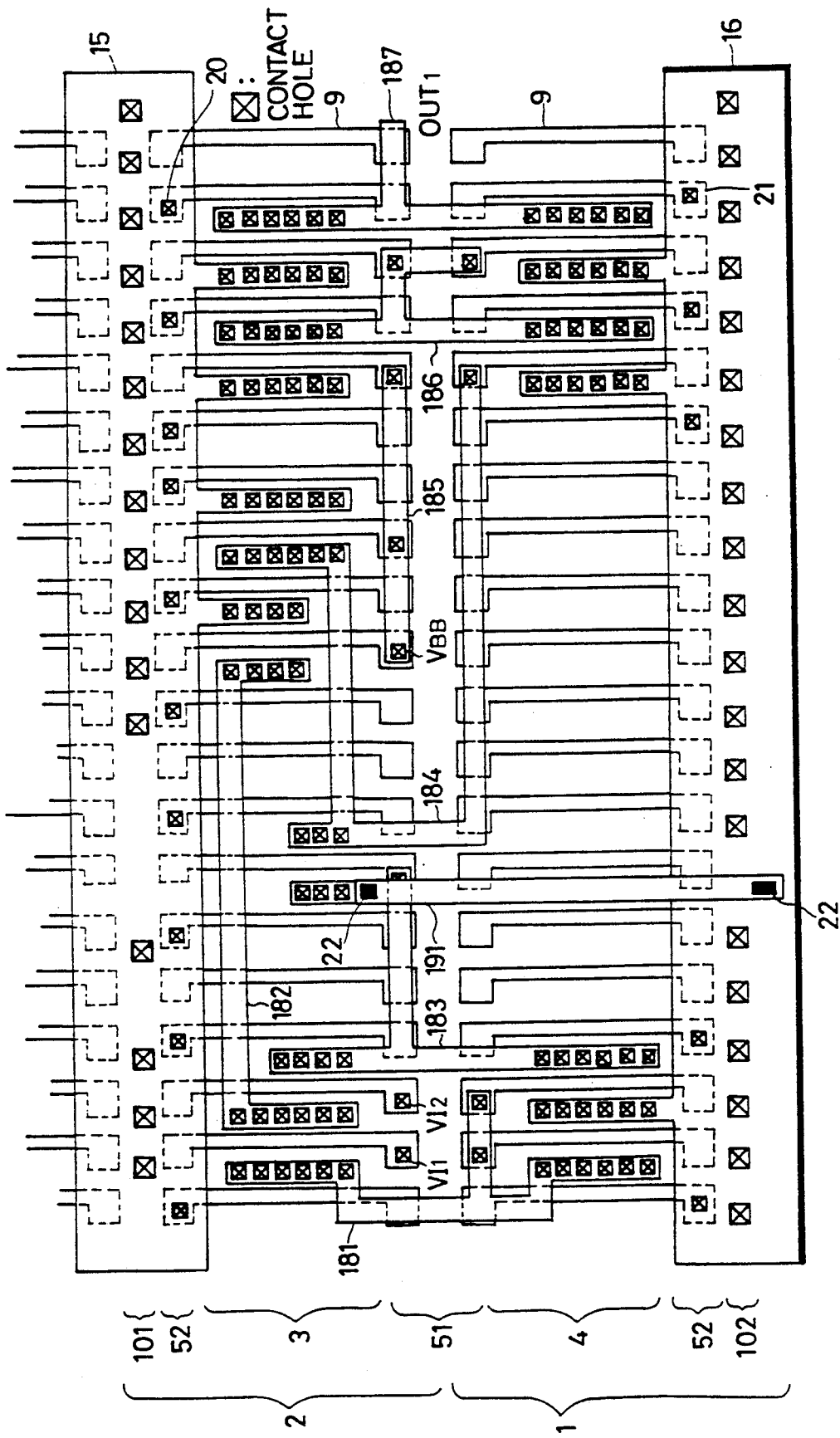
FIG. 11 is a diagram showing wirings in the basic cell array region in FIG. 6.
Figure 12:
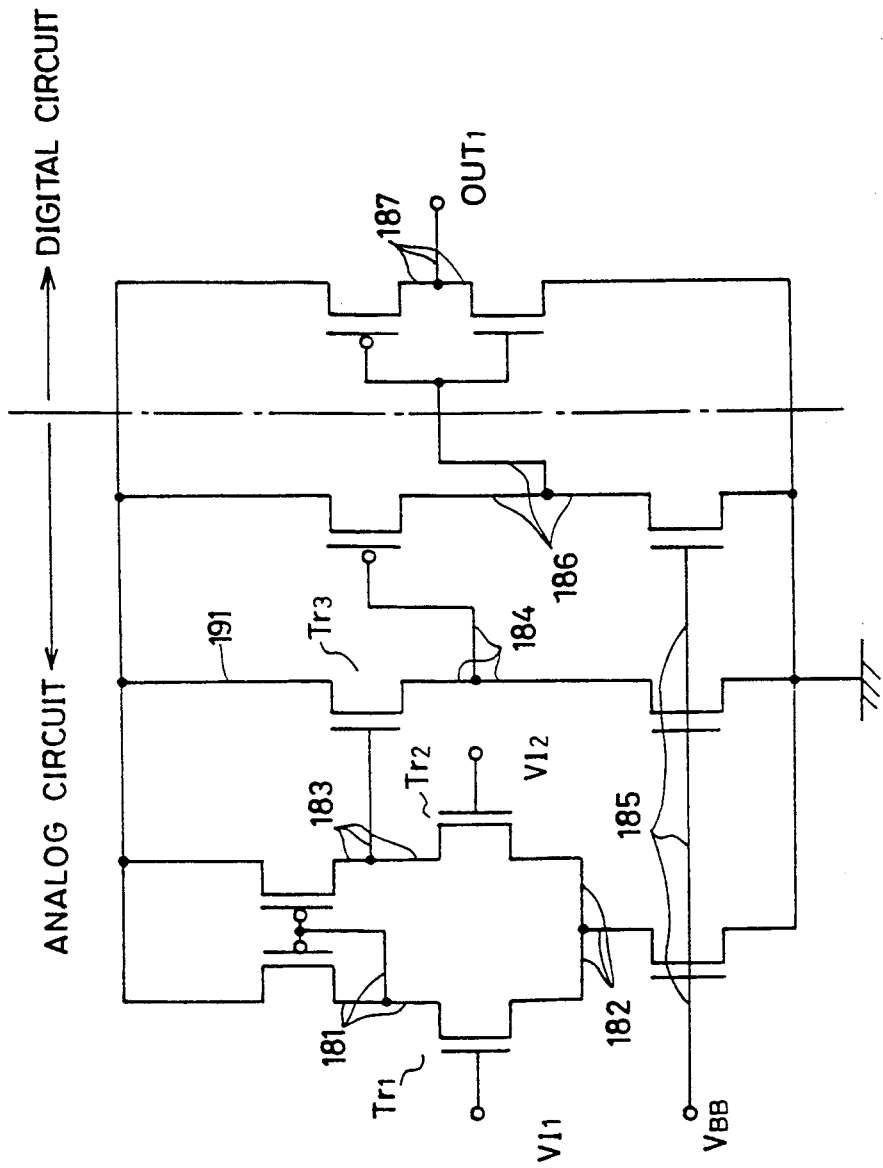
FIG. 12 is a specified circuit diagram taken from FIG. 11.
Figure 13:
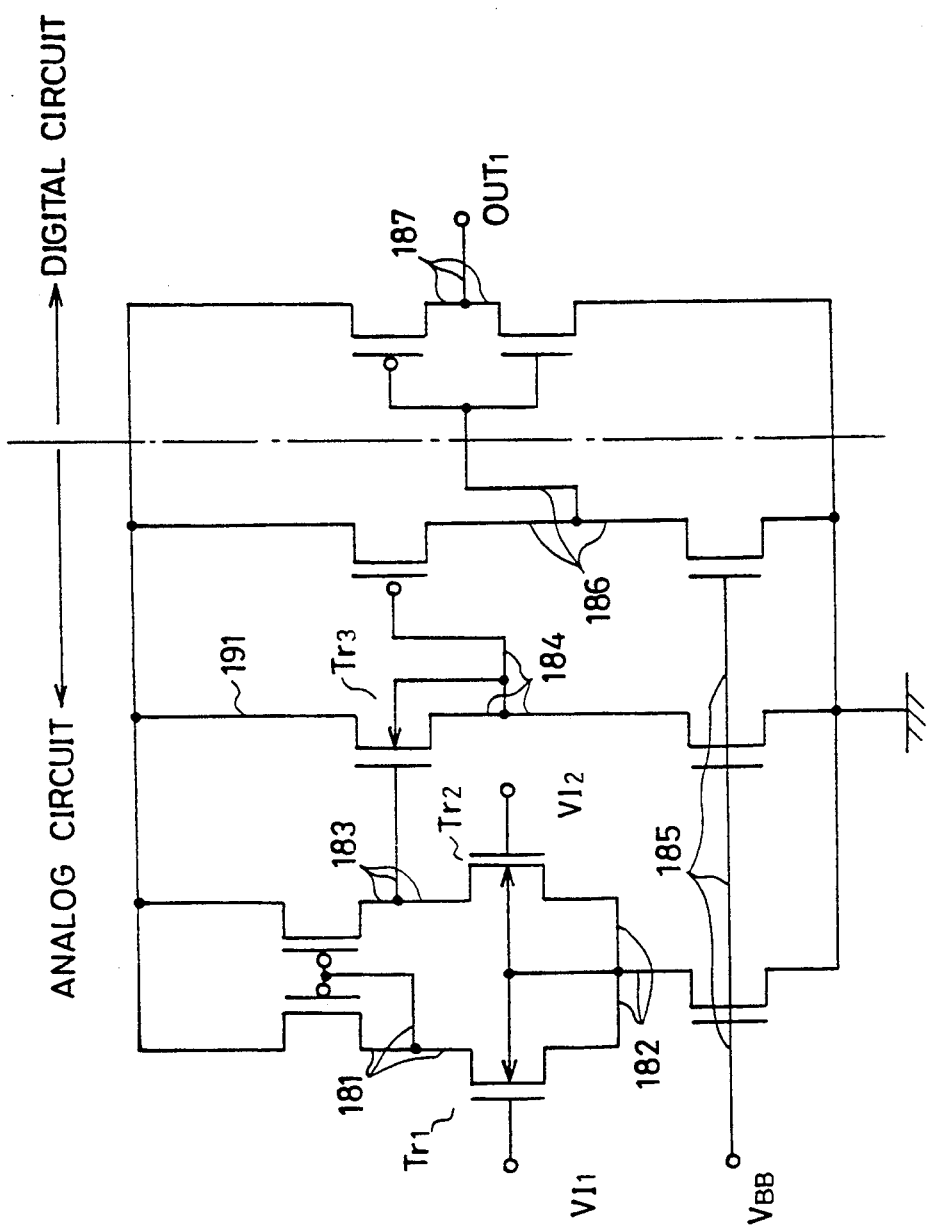
FIG. 13 is an ideal circuit connecting a high-precision analog circuit and a digital circuit, formed by the wiring pattern in FIG. 3.

FIG. 3 is a diagram showing an order made circuit formed by applying wirings to the basic cell array region 12. The circuit formed on the basic cell array region 12 is an ideal analog circuit shown in FIG. 13. The wiring pattern formed on the basic cell array 12 and the wiring pattern shown in FIG. 11 are different as described below. The wiring pattern shown in FIG. 3 includes a ground wiring 15, part of which is removed for formation of the analog circuit, wirings 189, 190 formed in a well terminal region 101, and a wiring 192 connecting the wirings 190 and 184. The wirings 189, 190 are connected to well terminals 101 through respective contact holes. The wiring 192 is connected to the wirings 190, 184 by means of through holes 23. Thus, sources of NMOS transistors Tr1, Tr2, Tr3 shown in FIG. 13 can be connected to P well regions 2. Consequently, a CMOS gate array system semiconductor integrated circuit makes it possible to mount an ideal analog circuit.

Figure 4A:
FIG. 4A to 4F are views showing a structure for isolating a P well region by an N type isolating region.
Figure 4B:
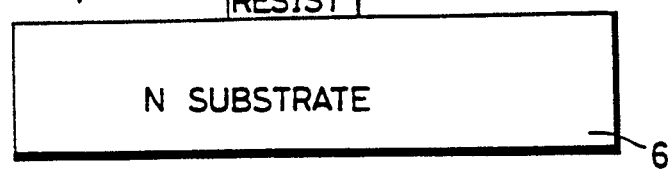
Figure 4C:
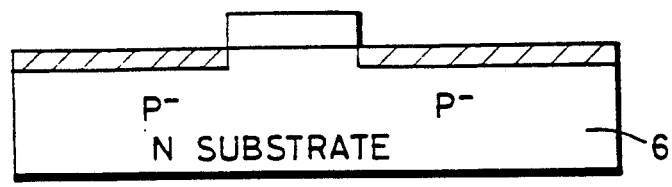
Figure 4D:
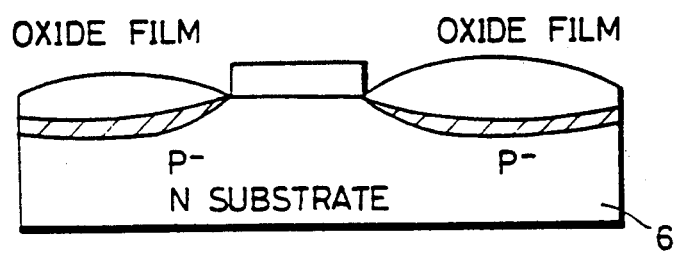
Figure 4E:
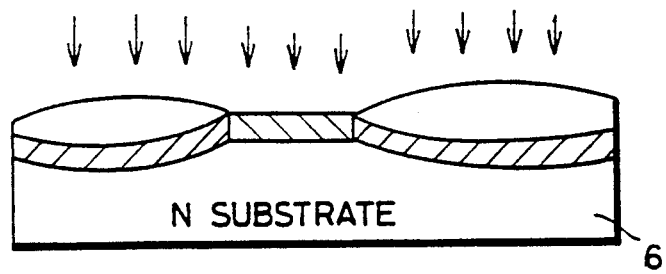
Figure 4F:
Figure 5:
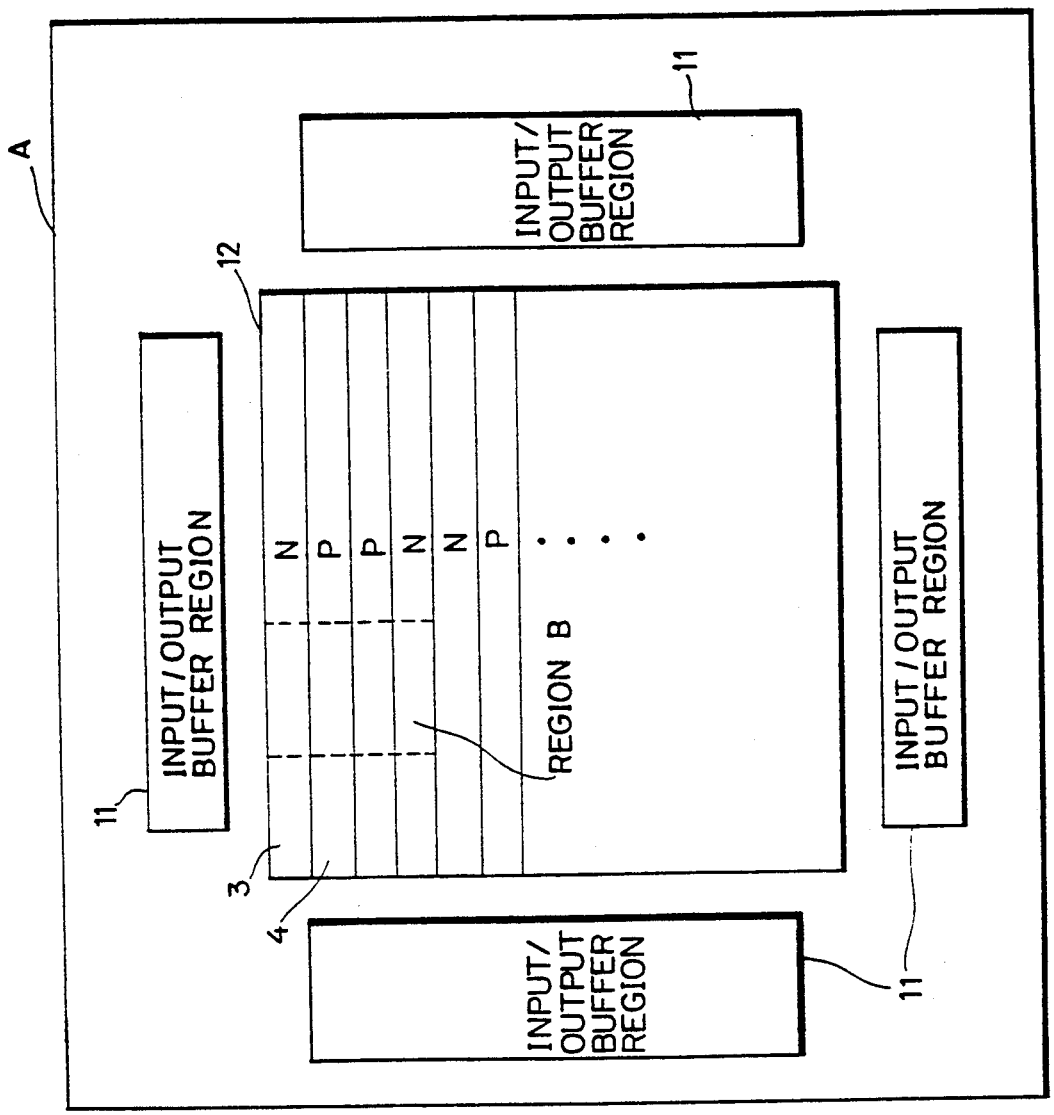
FIG. 5 is a structural view of a chip of a CMOS gate array.

FIGS. 4A to 4F are views explaining steps of forming P well regions shown in FIGS. 1 and 2. First, a resist film is formed in a position corresponding to a dividing region on the N substrate 6 and P type impurity (such as boron) is injected over the resist film (as shown in FIGS. 4A and 4B). As a result of injection of impurity, a P type layer is formed on both sides of the resist film (as shown in FIG. 4C). Then the surface of P type layer is oxidized, whereby an oxide film is formed. After that, the resist film is removed (as shown in FIG. 4D). Next, N type impurity (such as phosphorus) is injected and heat treatment is applied thereto, whereby the impurity is diffused (as shown in FIG. 4E). After the impurity diffusing process is terminated, the oxide film is removed (as shown in FIG. 4F). By the above-described steps, P well regions 2 and dividing regions 10 dividing the P well regions 2 are formed.

According to the embodiment shown in FIG. 1, the P well regions of the uppermost NMOS transistor array is divided by the N type dividing region 10. Alternatively, a dividing region may be formed in the P well regions of another NMOS transistor array in place of the uppermost NMOS transistor array.

In addition, dividing regions may be formed in a plurality of columns of P well regions.

Although an example of dividing the P well regions is shown in the embodiment in FIGS. 1 to 3, a plurality of P type dividing regions may be formed in an N well region 1 in place of the P well region 2, whereby N well regions are divided into small regions.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device of a gate array system, comprising:
   a semiconductor substrate,
   a plurality of field effect transistors of a first conductivity type having a plurality of well regions of a certain conductivity type of a first concentration formed separately along a first direction of said substrate, a plurality of regions of an opposite conductivity type of a second concentration formed along a second direction crossing said first direction in said well regions of the certain conductivity type, and a gate electrode formed between the adjacent regions of each pair of said regions of the opposite conductivity type of the second concentration,
   a plurality of field effect transistors of a second conductivity type having a plurality of well regions of the conductivity type opposite to said certain conductivity type formed in parallel with said well regions of the certain conductivity type, dividing regions of the certain conductivity type dividing said well regions of the opposite conductivity type into a plurality of small regions of the opposite conductivity type in positions at prescribed intervals along said first direction, a plurality of regions of the certain conductivity type of the second concentration formed along the second direction crossing said first direction in said small divided regions of the opposite conductivity type, and a gate electrode formed between the adjacent regions of each pair of said regions of the certain conductivity type of the second concentration,
   a plurality of well terminals formed in parallel with the field effect transistors of the first conductivity type and the field effect transistors of the second conductivity type, and connected to said well regions,
   a basic cell being formed by each said field effect transistor of the first conductivity type and the corresponding field effect transistor of the second conductivity type by means of each said well terminal, and a plurality of the basic cells being disposed in an array to constitute a basic cell array.

2. The semiconductor integrated circuit device of the gate array system in accordance with claim 1, wherein said basic cell array includes wiring members constituting a prescribed circuit by combination of the field effect transistors of the first conductivity type of said basic cells and the field effect transistors of the second conductivity type.

3. The semiconductor integrated circuit device of the gate array system in accordance with claim 2, wherein said prescribed circuit formed in specified regions of said small divided regions of the opposite conductivity type is formed as an analog circuit, and a circuit formed in other small divided regions of said conductivity type is formed as a digital circuit.

4. The semiconductor integrated circuit device of the gate array system in accordance with claim 2, wherein said wiring members connect sources of the field effect transistors of the second conductivity type to operate said field effect transistors of the second conductivity type with good precision.

5. The semiconductor integrated circuit device of the gate array system in accordance with claim 1, wherein said field effect transistors of the first conductivity type include P channel MOS field effect transistors, and said field effect transistors of the second conductivity type include NMOS field effect transistors.

6. The semiconductor integrated circuit of the gate array system in accordance with claim 1, wherein said semiconductor substrate includes input/output buffer means formed around said basic cell array.

* * * * *